United States Patent
Watanabe et al.

(10) Patent No.: US 12,512,810 B2
(45) Date of Patent: Dec. 30, 2025

(54) PIEZOELECTRIC DEVICE

(71) Applicant: Murata Manufacturing Co., Ltd., Nagaokakyo (JP)

(72) Inventors: Munehisa Watanabe, Nagaokakyo (JP); Yasumasa Taniguchi, Nagaokakyo (JP); Katsuya Daimon, Nagaokakyo (JP); Takuro Okada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 755 days.

(21) Appl. No.: 17/961,604

(22) Filed: Oct. 7, 2022

(65) Prior Publication Data
US 2023/0032680 A1    Feb. 2, 2023

Related U.S. Application Data

(63) Continuation of application No. PCT/JP2021/015373, filed on Apr. 14, 2021.

(30) Foreign Application Priority Data

Apr. 22, 2020  (JP) ................. 2020-076004

(51) Int. Cl.
*H03H 9/02* (2006.01)
*H03H 9/10* (2006.01)
*H03H 9/25* (2006.01)

(52) U.S. Cl.
CPC .... *H03H 9/02574* (2013.01); *H03H 9/02015* (2013.01); *H03H 9/25* (2013.01); *H03H 9/1035* (2013.01)

(58) Field of Classification Search
CPC .. H03H 9/02574; H03H 9/02015; H03H 9/25; H03H 9/02866
See application file for complete search history.

(56) References Cited

U.S. PATENT DOCUMENTS 8,253,301 B2 * 8/2012 Nishino ............... H10N 30/073
310/313 R
8,729,771 B2 * 5/2014 Kobayashi ......... H03H 9/02574
310/313 R (Continued)

FOREIGN PATENT DOCUMENTS

CN       1595799 A      3/2005
CN     110324021 A     10/2019

(Continued)

OTHER PUBLICATIONS

International Search Report in PCT/JP2021/015373, mailed Jun. 15, 2021, 3 pages.

(Continued)

*Primary Examiner* — Pedro J Cuevas
(74) *Attorney, Agent, or Firm* — Keating & Bennett, LLP

(57) ABSTRACT

A piezoelectric device includes a support substrate, an intermediate layer on the support substrate in a first region, a piezoelectric layer on the intermediate layer, a functional element on the piezoelectric layer, and an insulating layer. The insulating layer is located on the support substrate in a second region adjacent to the first region. A surface roughness of the support substrate in the second region is greater than a surface roughness of the support substrate in the first region.

7 Claims, 3 Drawing Sheets

(56) References Cited

U.S. PATENT DOCUMENTS

| | | | | |
|---|---|---|---|---|
| 8,866,365 | B2* | 10/2014 | Hori | H03H 9/0538 |
| | | | | 310/313 R |
| 9,015,914 | B2* | 4/2015 | Nishino | H03H 3/02 |
| | | | | 438/458 |
| 10,432,169 | B2* | 10/2019 | Tai | H10N 30/086 |
| 10,720,566 | B2* | 7/2020 | Tai | H03H 9/02834 |
| 10,964,882 | B2* | 3/2021 | Tai | H03H 9/25 |
| 11,336,259 | B2* | 5/2022 | Yamamoto | H03H 9/02866 |
| 11,962,282 | B2* | 4/2024 | Yamamoto | H03H 9/17 |
| 12,149,223 | B2* | 11/2024 | Taniguchi | H03H 9/02228 |
| 2003/0071539 | A1 | 4/2003 | Kuratani et al. | |
| 2005/0057324 | A1 | 3/2005 | Onishi et al. | |
| 2010/0052472 | A1* | 3/2010 | Nishino | H10N 30/073 |
| | | | | 29/25.35 |
| 2012/0086312 | A1* | 4/2012 | Kobayashi | H10N 30/073 |
| | | | | 29/25.35 |
| 2012/0284979 | A1* | 11/2012 | Nishino | H10N 30/073 |
| | | | | 29/25.35 |
| 2014/0145558 | A1* | 5/2014 | Hori | H10N 30/072 |
| | | | | 310/313 R |
| 2016/0277003 | A1 | 9/2016 | Kikuchi et al. | |
| 2018/0083597 | A1 | 3/2018 | Han et al. | |
| 2019/0305748 | A1 | 10/2019 | Yamane et al. | |
| 2019/0372547 | A1 | 12/2019 | Kishimoto et al. | |
| 2020/0228092 | A1* | 7/2020 | Nagatomo | H03H 9/589 |
| 2020/0313650 | A1* | 10/2020 | Yamamoto | H03H 9/02866 |
| 2020/0412326 | A1* | 12/2020 | Tanno | H03H 3/08 |
| 2021/0288628 | A1* | 9/2021 | Nishimura | H03H 9/02834 |
| 2021/0399709 | A1* | 12/2021 | Yamamoto | H03H 9/02102 |
| 2022/0094330 | A1* | 3/2022 | Yamamoto | H03H 9/02866 |
| 2022/0123711 | A1* | 4/2022 | Taniguchi | H03H 9/02574 |
| 2023/0032680 | A1* | 2/2023 | Watanabe | H03H 9/02015 |
| 2023/0223923 | A1* | 7/2023 | Inoue | H03H 9/02228 |
| | | | | 310/348 |
| 2023/0370043 | A1* | 11/2023 | Tanno | H03H 9/02559 |

FOREIGN PATENT DOCUMENTS

| | | | | | |
|---|---|---|---|---|---|
| CN | 111446942 | A | * | 7/2020 | H03H 9/175 |
| CN | 115428338 | A | * | 12/2022 | H03H 9/02866 |
| DE | 102011084045 | A1 | * | 4/2012 | H03H 9/02574 |
| DE | 102011084045 | B4 | * | 12/2016 | H03H 9/02574 |
| EP | 2736169 | A1 | * | 5/2014 | H03H 9/02622 |
| JP | 2001053579 | A | * | 2/2001 | |
| JP | 2003087073 | A | | 3/2003 | |
| JP | 2015115870 | A | * | 6/2015 | H03H 9/145 |
| JP | 2012085286 | A | * | 11/2015 | H03H 3/10 |
| JP | 5814727 | B2 | * | 12/2016 | H03H 9/02574 |
| JP | 2019179961 | A | | 10/2019 | |
| JP | 7511310 | B2 | * | 7/2024 | H03H 9/17 |
| JP | 7551318 | B2 | * | 9/2024 | H03H 9/25 |
| JP | 2025088236 | A | * | 6/2025 | H03H 9/76 |
| KR | 20120035900 | A | * | 4/2012 | H03H 9/02574 |
| KR | 101766487 | B1 | * | 8/2017 | H03H 3/10 |
| KR | 20220145884 | A | * | 10/2022 | H03H 9/25 |
| WO | WO-2014027538 | A1 | * | 2/2014 | H03H 9/02622 |
| WO | 2015098678 | A1 | | 7/2015 | |
| WO | 2018154950 | A1 | | 8/2018 | |

OTHER PUBLICATIONS

Written Opinion in PCT/JP2021/015373, mailed Jun. 15, 2021, 3 pages.

Official Communication issued in corresponding Chinese Patent Application No. 202180027877.8, mailed on May 12, 2025, 6 pages.

* cited by examiner

PIEZOELECTRIC DEVICE

CROSS REFERENCE TO RELATED APPLICATIONS

This application claims the benefit of priority to Japanese Patent Application No. 2020-076004 filed on Apr. 22, 2020 and is a Continuation Application of PCT Application No. PCT/JP2021/015373 filed on Apr. 14, 2021. The entire contents of each application are hereby incorporated herein by reference.

BACKGROUND OF THE INVENTION

1. Field of the Invention

The present disclosure relates to a piezoelectric device, and more specifically, to a technique for reducing higher-mode spurious responses generated in a piezoelectric device.

2. Description of the Related Art

Piezoelectric devices including a functional element formed on a piezoelectric thin film have been known. For example, International Publication No. 2015/098678 discloses an acoustic wave device including a comb-shaped Interdigital Transducer (IDT) electrode formed on a multilayer film in which a piezoelectric thin film is laminated on a laminated film constituted by a low-acoustic-velocity film and a high-acoustic-velocity film.

Regarding the acoustic wave device disclosed in International Publication No. 2015/098678, an insulating layer is formed on a support substrate in a region in which the multilayer film is not formed, and a wiring electrode for connecting the IDT electrode and an external terminal to one another is formed on the insulating layer.

Regarding an acoustic wave device (piezoelectric device) including a multilayer film, such as the acoustic wave device disclosed in International Publication No. 2015/098678, a resonant mode appearing in the layering direction due to the thickness of the multilayer film is generated in addition to a signal of a main mode based on the resonant frequency of the IDT electrode. Due to the resonant mode, an undesired higher-mode wave (spurious response) having a frequency higher than the resonant frequency of the IDT electrode is unavoidably generated. When such a spurious response is generated, the spurious response is superimposed, as a noise, on a high-frequency signal of the main mode propagated by the IDT electrode and may degrade the characteristics of the piezoelectric device.

In addition, such a higher-mode spurious response may also leak into the region of the insulating layer in which the multilayer film is not formed. In this case, the higher-mode spurious response that has leaked may have an influence on the characteristics of a piezoelectric device adjacent to the insulating layer interposed therebetween.

SUMMARY OF THE INVENTION

Preferred embodiments of the present invention reduce or prevent characteristic degradation due to higher-mode spurious responses generated in a piezoelectric device.

A piezoelectric device according to a preferred embodiment of the present invention includes a support substrate, an intermediate layer on the support substrate in a first region, a piezoelectric layer on the intermediate layer, a functional element on the piezoelectric layer, and an insulating layer. The insulating layer is located on the support substrate in a second region adjacent to the first region. A surface roughness of the support substrate in the second region is greater than a surface roughness of the support substrate in the first region.

With piezoelectric devices according to preferred embodiments of the present invention, in the support substrate, the surface roughness in the second region in which the insulating layer is provided is greater than the surface roughness in the first region in which the piezoelectric layer and the intermediate layer are provided. Thus, when the surface roughness is increased, variations in the thickness of the support substrate in the region is increased, and a resonant mode coinciding with the generated spurious responses is thus hardly generated, compared with a case in which the surface roughness is small. Accordingly, the higher-mode spurious responses that have leaked are easily attenuated, and it is thus possible to reduce or prevent characteristic degradation due to the spurious responses from being caused.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
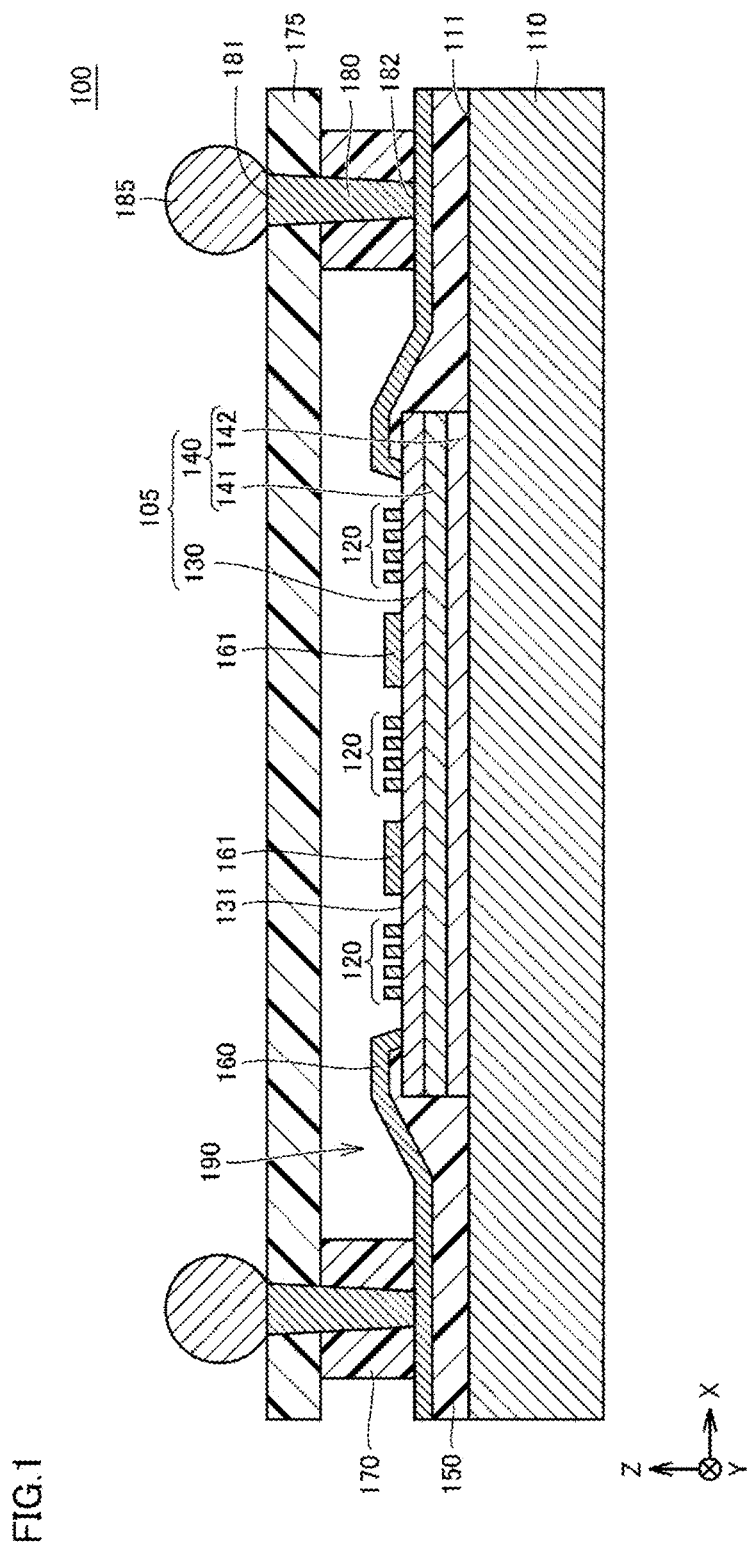
FIG. 1 is a sectional view of a piezoelectric device according to a first preferred embodiment of the present invention.

Hereinafter, preferred embodiments of the present disclosure will be described in detail with reference to the drawings. The same or equivalent portions in the drawings are denoted by the same reference, and the description thereof will not be repeated.

First Preferred Embodiment

Figure 2:
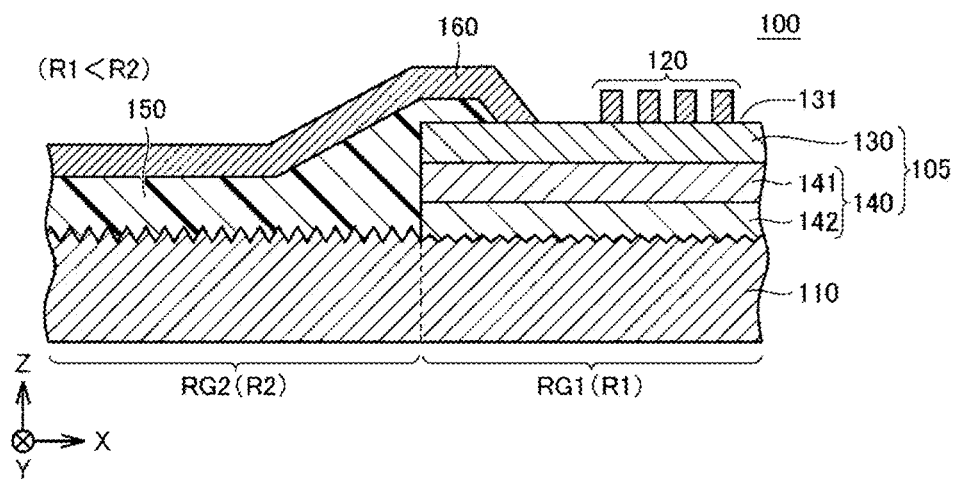
FIG. 2 is a partial sectional view of the piezoelectric device in FIG. 1.

FIG. 1 is a sectional view of a piezoelectric device 100 according to a first preferred embodiment of the present invention. In addition, FIG. 2 is an enlarged view of a portion of the section of the piezoelectric device 100 in FIG. 1. Referring to FIG. 1 and FIG. 2, the piezoelectric device 100 includes a support substrate 110, a functional element 120, a piezoelectric layer 130, an intermediate layer 140, an insulating layer 150, and a cover layer 175. In the following description, in the drawings, the positive Z-axis direction and the negative Z-axis direction are sometimes referred to as the upper surface side and the lower surface side, respectively.

Examples of the material of a substrate used for the support substrate 110 include piezoelectric materials such as lithium tantalate ($LiTaO_3$), lithium niobate ($LiNbO_3$), and quartz, various ceramics such as alumina ($Al_2O_3$), magnesia, silicon nitride (SiN), aluminum nitride (AlN), silicon carbide (SiC), zirconia (ZrO$_2$), cordierite, mullite, steatite, and forsterite, a dielectric material such as glass, semiconductors such as silicon (Si), sapphire, and gallium nitride (GaN), and resins.

A multilayer body 105 including the piezoelectric layer 130 and the intermediate layer 140 is provided on a portion of an upper surface 111 of the support substrate 110, and the functional elements 120 are provided on an upper surface 131 of the piezoelectric layer 130.

Examples of the material of the piezoelectric layer 130 include piezoelectric single crystal materials such as lithium tantalate, lithium niobate, zinc oxide (ZnO), aluminum nitride, and lead zirconate titanate (PZT), and a piezoelectric laminated material of any selections from the piezoelectric single crystal materials.

The functional elements 120 include an acoustic wave resonator including a comb-shaped IDT electrode. The piezoelectric layer 130 and the functional element 120 define a Surface Acoustic Wave (SAW) resonator. Examples of the material of the functional element 120 include metallic materials such as a single metal of at least one of aluminum (Al), copper (Cu), silver (Ag), gold (Au), titanium (Ti), tungsten (W), platinum (Pt), chromium (Cr), nickel (Ni), and molybdenum (Mo), and an alloy including, as a main component, a metal of the above-described examples. In addition, the functional element 120 may have a structure including a plurality of metal films of the above-described metals and alloys thereof that are laminated.

The intermediate layer 140 includes a high-acoustic-velocity layer 142 disposed on the upper surface 111 of the support substrate 110 and a low-acoustic-velocity layer 141 disposed on the high-acoustic-velocity layer 142. The high-acoustic-velocity layer 142 is structured so that, through high-acoustic-velocity layer 142, a bulk acoustic wave with a velocity higher than the velocity of an acoustic wave that propagates through the piezoelectric layer 130 propagates. Examples of the material of the high-acoustic-velocity layer 142 include a Diamond-Like Carbon (DLC) film, piezoelectric materials such as aluminum nitride, aluminum oxide, silicon carbide, silicon nitride, silicon, sapphire, lithium tantalate, lithium niobate, and quartz, various ceramics such as alumina, zirconia, cordierite, mullite, steatite, and forsterite; magnesia diamond, a material including, as a main component, any one of the above-described materials, and a material including, as a main component, a mixed material of any selections from the above-described materials.

The low-acoustic-velocity layer 141 is structured so that, through the low-acoustic-velocity layer 141, a bulk acoustic wave with a velocity lower than the velocity of a bulk wave that propagates through the piezoelectric layer 130 propagates. Examples of the material of the low-acoustic-velocity layer 141 include silicon oxide, glass, silicon oxynitride, and tantalum oxide, a compound formed by fluorine, carbon, or boron being added to silicon oxide, and a material including, as a main component, any one of the above-described materials. The acoustic wave that has been excited from the functional element 120 to the piezoelectric layer 130 is reflected due to a difference in acoustic velocity generated at the boundary between the low-acoustic-velocity layer 141 and the high-acoustic-velocity layer 142, and the energy of the acoustic wave can thereby be efficiently trapped inside the piezoelectric layer 130.

Although, regarding the piezoelectric device 100 of the first preferred embodiment, an example of the configuration in which the intermediate layer 140 includes the single low-acoustic-velocity layer 141 and the single high-acoustic-velocity layer 142 is described, the intermediate layer 140 may include a plurality of low-acoustic-velocity layers 141 and a plurality of high-acoustic-velocity layers 142 alternately laminated on one another. In addition, an adhesive layer may be provided between the low-acoustic-velocity layer 141 and the high-acoustic-velocity layer 142. Further, the intermediate layer 140 may be constituted by only the low-acoustic-velocity layer 141.

The insulating layer 150 is provided on the upper surface 111 of the support substrate 110 in a region in which the multilayer body 105 is not provided. On the support substrate 110, the insulating layer 150 is disposed so as to be in contact with a side surface of the multilayer body 105 (a surface, in the multilayer body 105, connecting a surface on the functional element 120 side to a surface on the support substrate 110 side) and in contact with the upper surface 131 of the piezoelectric layer 130 (a surface, in the piezoelectric layer 130, on which the functional elements 120 are provided). Examples of the material of the insulating layer 150 include a resin including, as a main component, a material such as epoxy, polyimide, acrylic, or urethane, silicone resin, and Spin-on Glass (SOG).

The cover layer 175 is supported by a support layer 170 at a position spaced away from the functional elements 120. Examples of the material of the cover layer 175 include a resin including, as a main component, a material such as epoxy, polyimide, acrylic, or urethane.

The support layer 170 is disposed on the upper surface of the insulating layer 150 so as to surround the periphery of the multilayer body 105. Examples of the material of the support layer 170 include a resin including an organic material such as polyimide, an epoxy-based resin, a cyclic olefin-based resin, benzocyclobutene, polybenzoxazole, a phenolic resin, silicone, or an acrylic resin. The support layer 170 and the cover layer 175 define a hollow space 190 between the multilayer body 105 and the cover layer 175. The functional elements 120 are provided inside the hollow space 190.

A columnar electrode 180 is provided so as to pass through the support layer 170 and the cover layer 175. The columnar electrode 180 includes, on the cover layer 175 side, a first end portion 181 connected to a connection electrode 185 that is to connect to an external device. The columnar electrode 180 includes a second end portion 182 electrically connected to a wiring electrode 160 provided on the upper surface of the insulating layer 150. The wiring electrode 160 provided over the upper surface of the insulating layer 150 and extending over the upper surface of the piezoelectric layer 130 is connected to the functional element 120 provided on the piezoelectric layer 130. The wiring electrode 160 and the columnar electrode 180 electrically connect the functional element 120 to the connection electrode 185. In addition, a wiring electrode 161 is provided on the upper surface 131 of the piezoelectric layer 130. The wiring electrode 161 electrically connects the functional elements 120 to one another.

Regarding the piezoelectric device 100 of the first preferred embodiment, in the support substrate 110, the surface roughness in a first region RG1 in which the multilayer body 105 differs from the surface roughness in a second region RG2 in which the insulating layer 150 is provided. Specifically, a surface roughness R2 in the second region RG2 is greater than a surface roughness R1 in the first region RG1 (R1<R2).

As with the piezoelectric device 100, regarding the configuration in which the intermediate layer 140 is provided between the piezoelectric layer 130 and the support substrate 110, a resonant mode in which propagation is performed in the thickness direction (Z-axis direction) according to the thickness of the intermediate layer 140, in addition to an acoustic wave of a main mode that propagates in the in-plane direction of the piezoelectric layer 130 based on the pitch of the IDT electrode. Due to such generation of the resonant mode in the thickness direction, a higher-mode spurious response having a frequency higher than the resonant frequency of the main mode is unavoidably generated. Such a spurious response is superimposed, as a noise, on a high-frequency signal of the main mode and may also have an influence on the characteristics of the piezoelectric device.

Moreover, higher-mode spurious responses may leak from the multilayer body 105 into the insulating layer 150, and, if such leakage occurs, the higher-mode spurious responses may have an influence on the characteristics of another adjacent piezoelectric device.

Regarding the above-described resonant mode appearing in the thickness direction, the more uniform the thickness of the intermediate layer 140 is, the higher the intensity of the resonance becomes, and, with such increase in the intensity of the resonance, the intensity of the higher-mode spurious responses is also increased. Thus, the surface roughness of a portion of the support substrate 110 in the first region RG1 in which the intermediate layer 140 is provided is increased to make the thickness of the intermediate layer 140 nonuniform, and it is thus possible to reduce the intensity of generated spurious responses. However, if the surface roughness in the first region RG1 is excessively increased, on the contrary in this case, the influence on a signal of the main mode is increased, and characteristic reduction may thus be caused. Thus, the degree of the surface roughness in the first region RG1 is limited to a range in which no influence is exerted on the main mode.

On the other hand, there is a small influence on the main mode in the second region RG2 in which the insulating layer 150 is provided. Thus, it is preferable to reduce or minimize the influence on another adjacent piezoelectric device by the surface roughness being increased to the greatest extent possible to reduce the intensity of the spurious responses that have leaked.

Thus, the surface roughness of the support substrate 110 in the piezoelectric device of the first preferred embodiment is made greater than the surface roughness of a support substrate provided through a known process. Moreover, the surface roughness R2 in the second region RG2 in which the insulating layer 150 is provided is greater than the surface roughness R1 in the first region RG1 in which the multilayer body 105 is provided (R1<R2). Specifically, when being represented by an arithmetic mean roughness Ra, the surface roughness R1 in the first region RG1 is set in a range of, for example, about 0.1 nm<R1<about 0.3 nm, and the surface roughness R2 in the second region RG2 is set in a range of about 1 nm<R2<about 100 nm (however, R1<R2).

In a non-limiting example of a manufacturing process, before the intermediate layer 140 is formed on the support substrate 110, a surface of the support substrate 110 is processed by, for example, laser milling or ion milling. Subsequently, after the intermediate layer 140 and the piezoelectric layer 130 are formed on the entire or substantially the entire upper surface of the support substrate 110, a portion of the multilayer body 105 in a region in which the insulating layer 150 is to be formed is removed by, for example, laser milling or etching. At this time, a portion of the multilayer body 105 corresponding to the second region RG2 is removed by using the condition under which a surface roughness is made greater than the surface roughness made under the condition of the surface processing performed before the formation of the multilayer body 105. By such a process being used, the surface roughness R2 in the second region RG2 can be made greater than the surface roughness R1 in the first region RG1.

As described above, in the piezoelectric device, the surface roughness of the support substrate in the region in which the insulating layer is formed is made greater than the surface roughness of the support substrate in the region in which the multilayer body is formed, and it is thus possible to reduce the influence of generated higher-mode spurious responses.

In addition, by the surface roughness of the support substrate being increased, the contact areas between the intermediate layer and the support substrate and between the insulating layer and the support substrate are increased, and the close-contact strength of the intermediate layer and the insulating layer can thus be increased. Therefore, the intermediate layer and the insulating layer can be reduced or prevented from being separated from the support substrate.

Second Preferred Embodiment

In the first preferred embodiment, the case where the surface roughness in the second region RG2 in which the insulating layer is provided is substantially uniform is described. However, the intensity of leaking spurious responses is greater toward the multilayer body and gradually decreases away from the multilayer body. Thus, in a second preferred embodiment, there will be described a configuration with which leaking spurious responses are attenuated more effectively by the surface roughness of a portion in the second region RG2 closer to the multilayer body being made greater than the surface roughness of a portion in the second region RG2 relatively far from the multilayer body.

Figure 3:
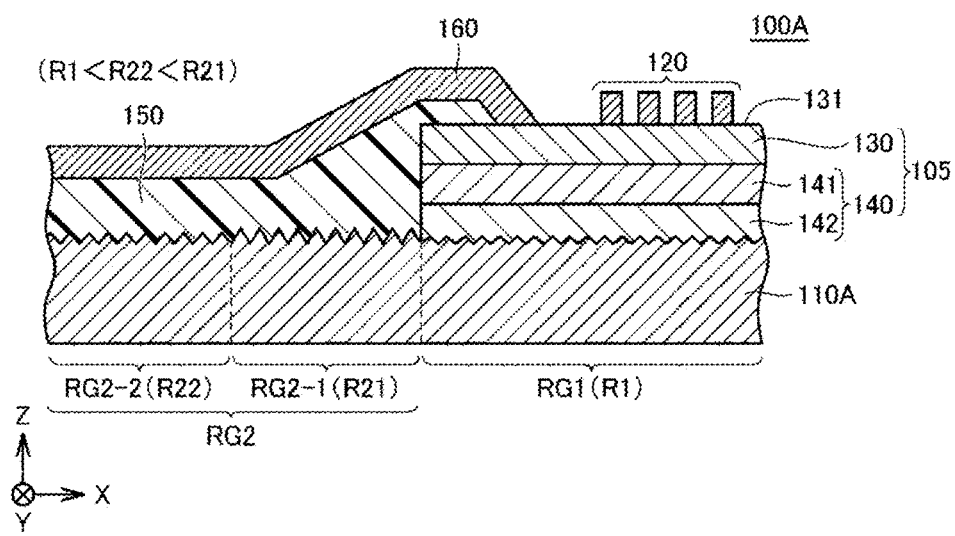
FIG. 3 is a partial sectional view of a piezoelectric device according to a second preferred embodiment of the present invention.

FIG. 3 is a partial sectional view of a piezoelectric device 100A according to a second preferred embodiment of the present invention. The piezoelectric device 100A has a configuration the same as or similar to the piezoelectric device 100. However, the support substrate 110 is replaced by a support substrate 110A. Thus, in the following description, the description of the same or equivalent elements as the elements of the piezoelectric device 100 will not be repeated.

Referring to FIG. 3, in the piezoelectric device 100A, the second region RG2 of the support substrate 110A in which the insulating layer 150 is provided is divided into a first portion RG2-1 and a second portion RG2-2. The first portion RG2-1 is a region adjacent to the first region RG1 of the support substrate 110A in which the multilayer body 105 is provided. The second portion RG2-2 is a region positioned farther away from the first region RG1 than the first portion RG2-1.

A surface roughness R21 in the first portion RG2-1 is greater than a surface roughness R22 in the second portion RG2-2. That is, the relationship, regarding the degree of surface roughness, including the surface roughness in the first region RG1 is expressed by R1<R22<R21.

Leaking spurious responses can be effectively reduced or prevented in a region close to the multilayer body by the surface roughness of the support substrate 110A being set as described above.

Although, in the above-described example, the case where the surface roughness R22 in the second portion RG2-2 in the second region RG2 is greater than the surface roughness R1 in the first region RG1 is described, the surface roughness R22 in the second portion RG2-2 may be smaller than or equal to the surface roughness R1 in the first region RG1 when leaking spurious responses can be sufficiently reduced or prevented by using the first portion RG2-1 in the second region RG2.

Third Preferred Embodiment

In a third preferred embodiment of the present invention, a configuration enabling a reduction in the stress at the boundary between the first region and the second region of the support substrate is described.

Figure 4:
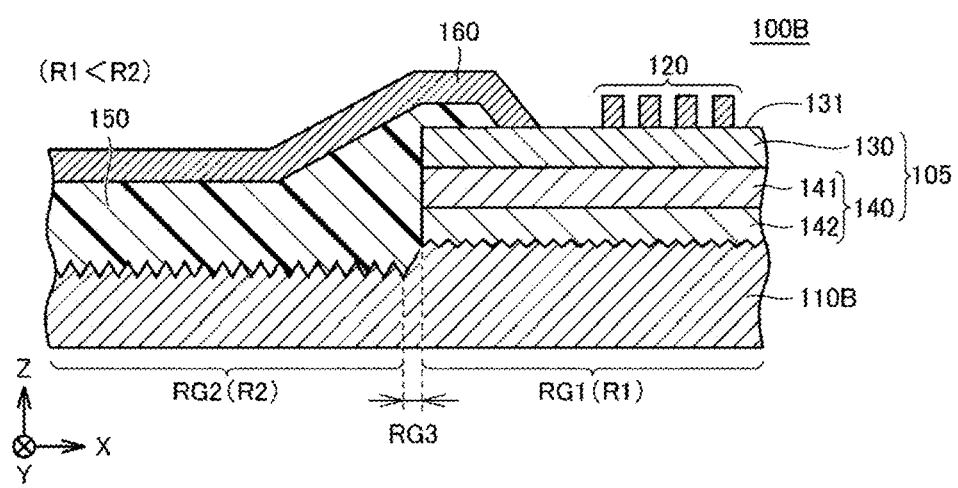
FIG. 4 is a partial sectional view of a piezoelectric device according to a third preferred embodiment of the present invention.

FIG. 4 is a partial sectional view of a piezoelectric device 100B according to the third preferred embodiment. The piezoelectric device 100B has a configuration the same as or similar to the piezoelectric device 100. However, the support substrate 110 is replaced by a support substrate 110B. Thus, in the following description, the description of the same or equivalent elements as the elements of the piezoelectric device 100 will not be repeated.

Referring to FIG. 4, in the support substrate 110B of the piezoelectric device 100B, the thickness of a portion in the second region RG2 in which the insulating layer 150 is provided (the dimension in the Z-axis direction) is smaller than the thickness of a portion in the first region RG1 in which the multilayer body 105 is provided. In other words, the upper surface of the portion in the second region RG2 is at a position in the negative Z-axis direction relative to the upper surface in the first region RG1. In addition, an inclined region RG3 in which the thickness of the support substrate 110 is continuously changed is provided between the first region RG1 and the second region RG2. That is, the second region RG2 is adjacent to the first region RG1 with the inclined region RG3 interposed therebetween. The inclined region RG3 may be structured so that the section thereof has a line shape or an arc shape, for example.

As FIG. 4 illustrates, when a side surface of the multilayer body is perpendicular or substantially perpendicular to the support substrate, stress concentration is likely to be caused at a boundary portion of the multilayer body and the support substrate. Due to such stress concentration, the multilayer body or the insulating layer may be separated from the support substrate, or the support substrate may be cracked.

As with the piezoelectric device 100B of the third preferred embodiment, by the inclined region RG3 being provided between the first region RG1 and the second region RG2 of the support substrate 110B, the concentration of the stress acting on the boundary portion of the multilayer body 105 and the support substrate 110B can be reduced. Thus, the multilayer body 105 and the insulating layer 150 can be reduced or prevented from being separated from the support substrate 110B, and the support substrate 110B can be reduced or prevented from being damaged.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a support substrate;
   an intermediate layer on the support substrate in a first region;
   a piezoelectric layer on the intermediate layer;
   a functional element on the piezoelectric layer; and
   an insulating layer on the support substrate in a second region adjacent to the first region; wherein
   a surface roughness of the support substrate in the second region is greater than a surface roughness of the support substrate in the first region.

2. The piezoelectric device according to claim 1, wherein
   the second region includes a first portion adjacent to the first region and a second portion farther away from the first region than the first portion; and
   a surface roughness of the support substrate in the first portion is greater than a surface roughness of the support substrate in the second portion.

3. The piezoelectric device according to claim 2, wherein
   a thickness of the support substrate in the second region is smaller than a thickness of the support substrate in the first region; and
   the support substrate includes an inclined region between the first region and the second region.

4. The piezoelectric device according to claim 2, wherein the intermediate layer includes:
   a high-acoustic-velocity layer on the support substrate and through which a bulk acoustic wave with a velocity higher than a velocity of a bulk acoustic wave that propagates to the piezoelectric layer propagates; and
   a low-acoustic-velocity layer between the high-acoustic-velocity layer and the piezoelectric layer and through which a bulk acoustic wave with a velocity lower than a velocity of an acoustic wave that propagates to the piezoelectric layer propagates.

5. The piezoelectric device according to claim 1, wherein
   a thickness of the support substrate in the second region is smaller than a thickness of the support substrate in the first region; and
   the support substrate includes an inclined region between the first region and the second region.

6. The piezoelectric device according to claim 5, wherein the intermediate layer includes:
   a high-acoustic-velocity layer on the support substrate and through which a bulk acoustic wave with a velocity higher than a velocity of a bulk acoustic wave that propagates to the piezoelectric layer propagates; and
   a low-acoustic-velocity layer between the high-acoustic-velocity layer and the piezoelectric layer and through which a bulk acoustic wave with a velocity lower than a velocity of an acoustic wave that propagates to the piezoelectric layer propagates.

7. The piezoelectric device according to claim 1, wherein the intermediate layer includes:
   a high-acoustic-velocity layer on the support substrate and through which a bulk acoustic wave with a velocity higher than a velocity of a bulk acoustic wave that propagates to the piezoelectric layer propagates; and
   a low-acoustic-velocity layer between the high-acoustic-velocity layer and the piezoelectric layer and through which a bulk acoustic wave with a velocity lower than a velocity of an acoustic wave that propagates to the piezoelectric layer propagates.

* * * * *